US007019370B2

United States Patent
Cha

(10) Patent No.: US 7,019,370 B2
(45) Date of Patent: Mar. 28, 2006

(54) METHOD FOR MANUFACTURING MAGNETIC RANDOM ACCESS MEMORY

(75) Inventor: Seon Yong Cha, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/879,153

(22) Filed: Jun. 30, 2004

(65) Prior Publication Data

US 2005/0139880 A1 Jun. 30, 2005

(30) Foreign Application Priority Data

Dec. 24, 2003 (KR) .................. 10-2003-0096067

(51) Int. Cl.
*H01L 29/82* (2006.01)
*H01L 43/00* (2006.01)
(52) U.S. Cl. ................ 257/421; 257/295; 257/E27.006

(58) Field of Classification Search ................ 257/421, 257/E27.006, 295
See application file for complete search history.

(56) References Cited

U.S. PATENT DOCUMENTS

| 5,940,319 | A | 8/1999 | Durlam et al. |
| 2002/0080641 | A1* | 6/2002 | Asao et al. .................. 365/63 |
| 2003/0198080 | A1* | 10/2003 | Iwata .......................... 365/158 |

* cited by examiner

*Primary Examiner*—Tu-Tu Ho
(74) *Attorney, Agent, or Firm*—Heller Ehrman LLP

(57) ABSTRACT

The present invention discloses an MRAM wherein a write word line is disposed between every other set of the word lines and a ground line is disposed between every other bit lines. This structure of MRAM in accordance with the present invention, Which is similar to folded bit line DRAM having a unit cell area of 8F2, allows read and write operation of MRAM with reduced number of required lines.

1 Claim, 3 Drawing Sheets

METHOD FOR MANUFACTURING MAGNETIC RANDOM ACCESS MEMORY

BACKGROUND OF THE INVENTION

1. Field of the Invention

The present invention relates to magnetic random access memory ('MRAM'), and in particular to an improved MRAM having a similar structure to folded bit line DRAM having a unit cell area of 8F2, wherein lines are arranged in a way that only one write word line is required for every two word line and only one ground line is required for every two bit line.

2. Description of the Background Art

Most of the semiconductor memory manufacturing companies have developed the MRAM, which uses a ferromagnetic material as one of the next generation memory devices.

The MRAM is a memory device for reading and writing information wherein multi-layer ferromagnetic thin films is used by sensing current variations according to a magnetization direction of the respective thin films. The MRAM has a high speed and low power consumption, and allows high integration density due to its unique properties of the magnetic thin film, and also performs a nonvolatile memory operation such as a flash memory.

The MRAM embodies a memory device by using a giant magneto resistive (GMR) or spin-polarized magneto-transmission (SPMT) phenomenon generated when the spin influences electron transmission.

The MRAM using the GMR phenomenon utilizes the fact that resistance remarkably varies when spin directions are different in two magnetic layers having a non-magnetic layer therebetween to implement a GMR magnetic memory device.

The MRAM using the SPMT phenomenon utilizes the fact that larger current transmission is generated when spin directions are identical in two magnetic layers having an insulating layer therebetween to implement a magnetic permeable junction memory device.

FIG. 1 is a schematic diagram illustrating a conventional MRAM and FIG. 2 is a cross-sectional diagram illustrating the conventional MRAM of FIG. 1.

Referring to FIGS. 1 and 2, the conventional MRAM comprises a transistor and an MTJ cell 80. The MTJ cell 80 is connected to a bit line 90 and to a drain region 30 of the transistor through a connection layer 60 and a contact plug 50. The MRAM further comprises a write word line 70 for storing information by varying the magnetization direction of MTJ cell 80. A gate electrode 20 of the transistor serves as a word line for reading the data. A source region 40 of the transistor is connected to ground through a ground line 45.

The conventional MRAM, contrary to a DRAM, requires four independent lines including the ground line, the word line, the write word line and the bit line.

SUMMARY OF THE INVENTION

Accordingly, it is an object of the present invention to provide MRAM wherein lines are arranged in a way that only one write word line is required for every two word line and only one ground line is required for every two bit line and wherein the structure is similar to folded bit line DRAM having a unit cell area of 8F2.

In order to achieve the above-described object of the invention, there is provided an MRAM comprising: a matrix type active region defined by a device isolation film; a set of word lines extending across the active region so as to divide the active region into three regions including two drain regions and a source region therebetween; a write word line disposed between every other set of the word lines and extending parallel to the word line; a bit line overlapping the active region and extending perpendicular to the word line; a ground line disposed between every other bit line and extending parallel to the bit line; and a MTJ cell disposed at a crossing of the bit line and the write word line, wherein an upper surface and a lower surface of the MTJ cell is connected to the bit line and to the drain region, respectively, and the ground line is connected to the source region.

In order to achieve the above-described object of the invention, there is also provided an MRAM comprising: drain regions disposed on an active region of a semiconductor substrate; a source region disposed on the active region between the drain regions; two word lines disposed on the semiconductor substrate between the source region and the drain regions; a ground line electrically connected to the source region; a first write word line disposed above and electrically isolated from the source region; a second write word line disposed above the device isolation film adjacent to the drain region; a first and a second MTJ cells disposed above and electrically isolated from the first and the second write word lines, respectively, wherein lower surfaces of the first and the second MTJ cells are connected to the drain regions, respectively; and a bit line overlapping the active region and electrically connected to an upper surface of the MTJ cells.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing MRAM in accordance with a preferred embodiment of the present invention will now be described in detail with reference to the accompanying drawings.

Figure 1:
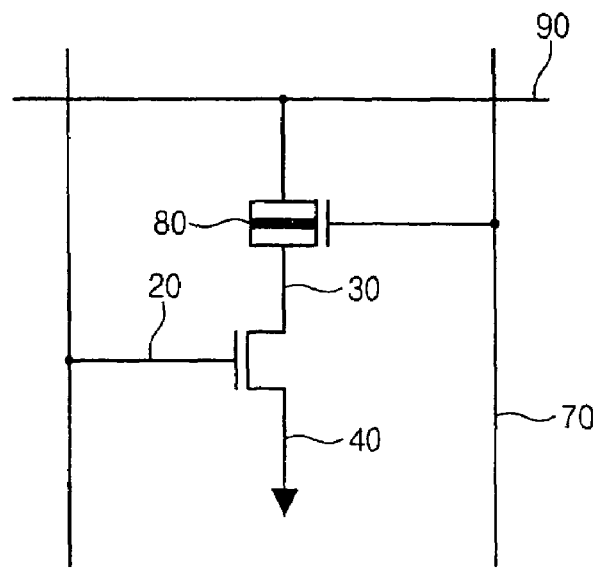
FIG. 1 is a schematic diagram illustrating a conventional MRAM.
Figure 2:
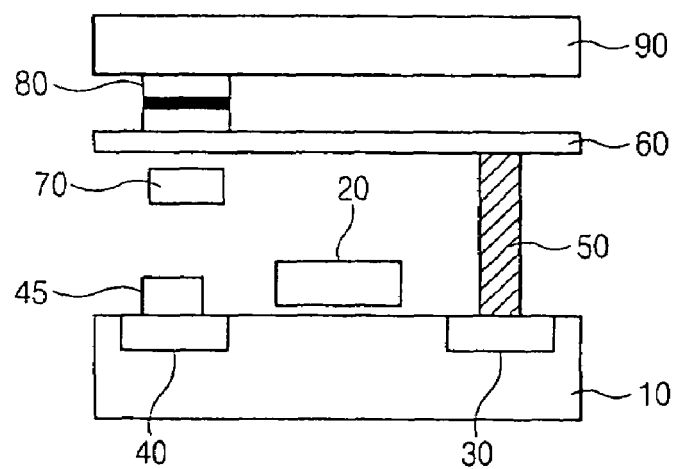
FIG. 2 is a cross-sectional diagram illustrating the conventional MRAM of FIG. 1.
Figure 3:
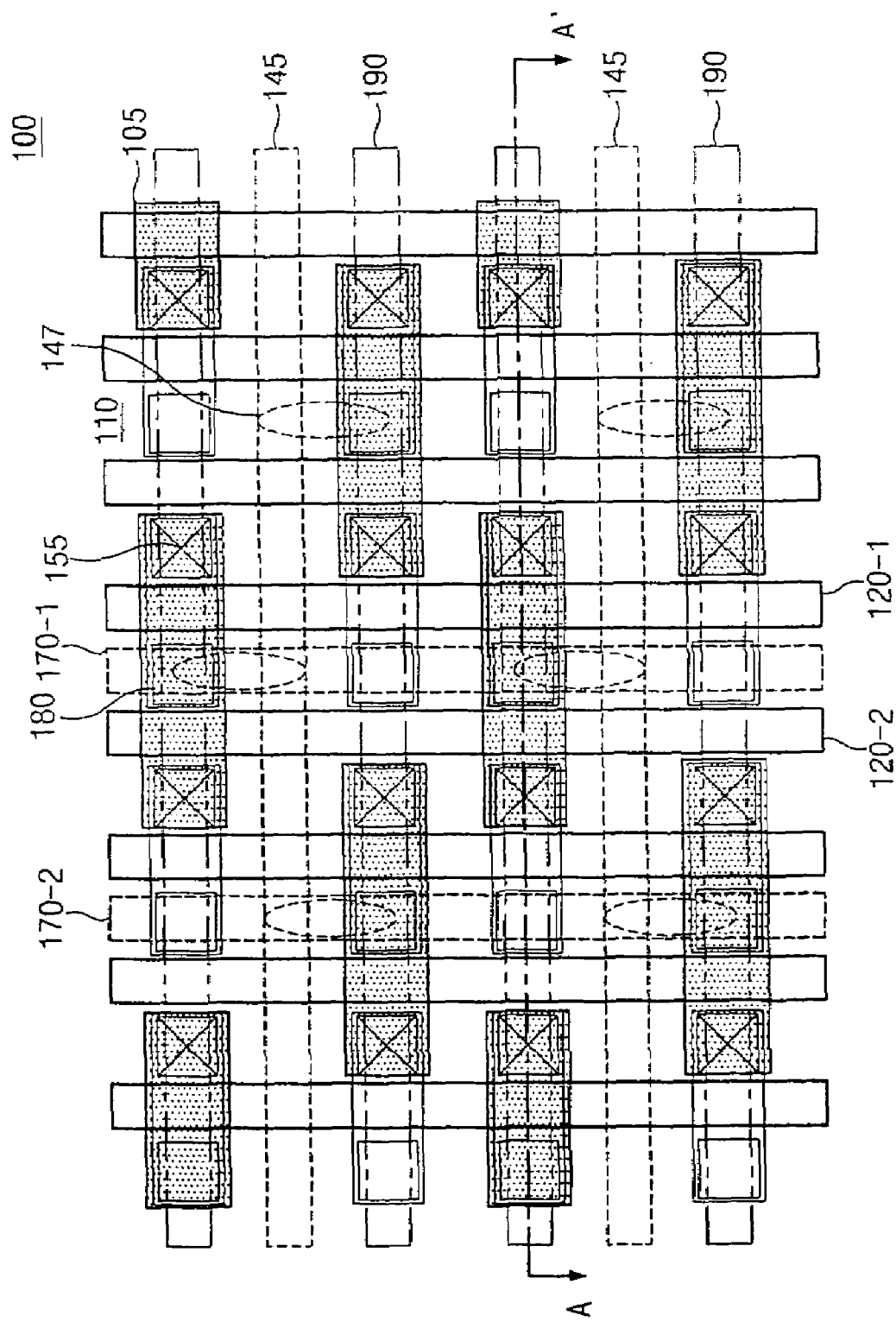
FIG. 3 is a layout view illustrating MRAM in accordance with the present invention.

FIG. 3 is a layout view illustrating MRAM in accordance with the present invention.

Referring to FIG. 3, the inventive MRAM comprises an active region 105 defined by a device isolation film 110 formed on a semiconductor substrate 100. The active region 105 is a matrix type active region, i.e. alternately arranged.

A set of word lines 120-1 and 120-2 for reading data extends across the active region 105. The set of the word lines 120-1 and 120-2 divides the active region 105 into three regions including two drain regions (not shown) and a source region (not shown) in a center portion of the active region 105 between the set of the word lines 120-1 and 120-2.

A write word line 170 is disposed between every other set of the word lines and extends parallel to the word lines 120-1 and 120-2.

A bit line 190 overlaps the active region 105 and extends perpendicular to the word lines 120-1 and 120-2.

The MRAM further comprises a ground line 145 disposed between every other bit line 190, i.e. alternately arranged between the bit line 190. The ground line 145 extends parallel to the bit line 190 and is connected to the source regions of the active regions 105 disposed adjacent to the ground line 145 through contact plugs 147.

MTJ cell 180 is disposed at a crossing of the bit line 190 and the write word line 170. An upper surface and a lower surface of the MTJ cell are connected to the bit line 190 and to the drain region through a contact plug 155, respectively.

Figure 4:
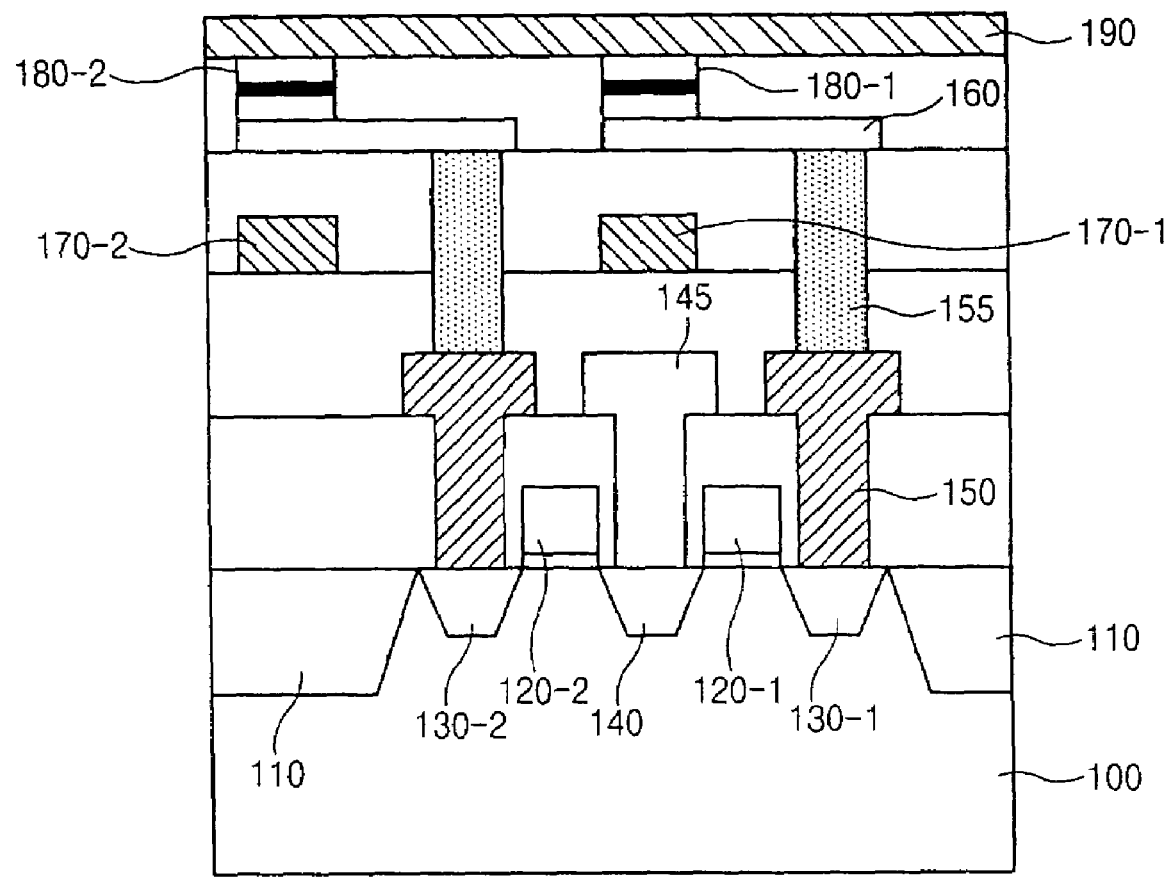
FIG. 4 is a cross-sectional view illustrating MRAM in accordance with the present invention, taken along the line A–A' of FIG. 3.

FIG. 4 is a cross-sectional view illustrating MRAM in accordance with the present invention, taken along the line A–A' of FIG. 3.

Referring to FIG. 4, the inventive MRAM comprises a semiconductor substrate 100 including an active region defined by a device isolation film 110. The active region comprises drain regions 130-1 and 130-2 and a source region 140 disposed between the drain regions 130-1 and 130-2. Word lines 120-1 and 120-2 are disposed on the semiconductor substrate 100 between the source region 140 and the drain regions 130-1 and 130-2.

A ground line 145 is disposed above and electrically connected to the source region 140.

A first write word line 170-1 is disposed above and electrically isolated from the source region 140 and a second write word line 170-2 is disposed above the device isolation film 140 adjacent to the drain region 130-2.

A first MTJ cell 180-1 is disposed above and electrically isolated from the first write word line 170-1, and a second MTJ cell 180-2 is disposed above and electrically isolated from the second write word line 170-2. Lower surfaces of the first and the second MTJ cells 180-1 and 180-2 are respectively connected to the drain regions 130-1 and 130-2 through a connection layer 160 and contact plugs 155 and 150.

A bit line 190 is disposed to overlap the active region and connected to and electrically connected to upper surfaces of the first and the second MTJ cells 180-1 and 180-2.

As discussed earlier, in accordance with the present invention, the MRAM of the present invention requires one write word line for every two word line, and one ground line for every two bit line, thereby reducing the number of liens to increase the integration density of the device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. An MRAM comprising:
  a matrix type active region defined by a device isolation film;
  a set of word lines extending across the active region so as to divide the active region into three regions including two drain regions and a source region therebetween;
  a write word line disposed between every other set of the word lines and extending parallel to the word line;
  a bit line overlapping the active region and extending perpendicular to the word line;
  a ground line disposed between every other bit line and extending parallel to the bit line; and
  a magnetic tunnel junction cell disposed at a crossing of the bit line and the write word line,
  wherein an upper surface and a lower surface of the magnetic tunnel junction cell is connected to the bit line and to the drain region, respectively, and the ground line is connected to the source region.

* * * * *